(12) United States Patent
Kwon et al.

(10) Patent No.: US 8,131,985 B2
(45) Date of Patent: Mar. 6, 2012

(54) SEMICONDUCTOR MEMORY DEVICE HAVING PROCESSOR RESET FUNCTION AND RESET CONTROL METHOD THEREOF

(75) Inventors: Jin-Hyoung Kwon, Seongnam-si (KR); Han-Gu Sohn, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 932 days.

(21) Appl. No.: 12/140,428

(22) Filed: Jun. 17, 2008

(65) Prior Publication Data
US 2008/0313418 A1 Dec. 18, 2008

(30) Foreign Application Priority Data
Jun. 18, 2007 (KR) .................. 10-2007-0059368

(51) Int. Cl.
G06F 9/00 (2006.01)
G06F 15/16 (2006.01)
G06F 12/00 (2006.01)
G06F 15/00 (2006.01)
G06F 11/00 (2006.01)

(52) U.S. Cl. ............... 713/1; 713/2; 713/375; 709/208; 711/147; 712/28; 712/31; 712/32; 714/10; 714/23

(58) Field of Classification Search .............. 713/1, 2, 713/375; 709/208; 711/147; 712/28, 31, 712/32; 714/10, 23
See application file for complete search history.

(56) References Cited

U.S. PATENT DOCUMENTS
4,943,911 A * 7/1990 Kopp et al. .................. 713/2
5,898,869 A * 4/1999 Anderson .................... 713/2
2003/0093628 A1 5/2003 Matter et al.

FOREIGN PATENT DOCUMENTS
JP 2003-330902 11/2003
JP 2003330902 A * 11/2003
KR 0167431 9/1998
KR 10-0382939 4/2003
* cited by examiner Primary Examiner — Stefan Stoynov
(74) Attorney, Agent, or Firm — Volentine & Whitt, PLLC

(57) ABSTRACT

A semiconductor memory device for use in a multiprocessor system includes a shared memory area and a reset signal generator. The shared memory area is accessible by the processors of the multiprocessor system through different ports, and is assigned to a portion of a memory cell array. The reset signal generator is configured to provide a reset enable signal to a processor, predetermined as a slave processor among the multiple processors, for a predetermined time after an initial booting of the multiprocessor system. The reset signal generator also provides a reset disable signal to the slave processor after the predetermined time lapses.

15 Claims, 11 Drawing Sheets

SEMICONDUCTOR MEMORY DEVICE HAVING PROCESSOR RESET FUNCTION AND RESET CONTROL METHOD THEREOF

CROSS REFERENCE TO RELATED APPLICATIONS

A claim of priority is made to Korean Patent Application No. 10-2007-0059368, filed on Jun. 18, 2007, the subject matter of which is hereby incorporated by reference.

BACKGROUND AND SUMMARY

1. Technical Field

The present invention relates to semiconductor memory devices, and more particularly, to a semiconductor memory device having a processor reset function.

2. Description of Related Art

In general, a semiconductor memory device having multiple access ports is called a multiport memory. More particularly, a memory device having two access ports is called a dual-port memory. A typical dual-port memory may be an image processing video memory having a random access memory (RAM) port accessible in a random sequence and a serial access memory (SAM) port accessible only in a serial sequence.

A multipath accessible semiconductor memory device is distinguishable from a multiport memory. Unlike the configuration of the video memory, a multipath accessible semiconductor memory device includes a dynamic random access memory (DRAM), which has a shared memory area accessible by respective processors through multiple access ports. A memory cell array of the device does not have a SAM port, but is constructed of DRAM cells.

Universally, remarkable developments are being made in consumer electronic systems. For example, in recent mobile communication systems, such as handheld multimedia players, handheld phones, PDAs, etc., manufacturers are producing products having multiprocessor systems, which incorporate processors adapted in one system to obtain higher speeds and smoother operations.

An example of a conventional memory adequate for a multiprocessor system is disclosed by MATTER et al. (U.S. Patent Application Publication No. 2003/0093628), published May 15, 2003. MATTER et al. generally discloses technology for accessing a shared memory area by multiple processors, in which a memory array includes first, second and third portions. The first portion of the memory array is accessed only by a first processor, the second portion is accessed only by a second processor, and the third portion is a shared memory area accessed by both the first and second processors.

In contrast, a general multiprocessor system has a nonvolatile memory that stores processor boot codes, e.g., a flash memory, for processors. A DRAM is also adapted as a volatile memory for every corresponding processor. That is, the DRAM and the flash memory are each adapted to one processor. The configuration of the processor system is therefore complicated and costly.

Therefore, a multiprocessor system adaptable to a mobile communication device was developed, as shown in FIG. 1. More particularly, FIG. 1 is a schematic block diagram of a conventional multiprocessor system having a multipath accessible DRAM.

As shown in FIG. 1, in a multiprocessor system including two or more processors 100 and 200, one DRAM 400 and one flash memory 300 are shared. Also, a data interface between processors 100 and 200 is obtained through the multipath accessible DRAM 400. In FIG. 1, the first processor 100, which is not directly connected to the flash memory 300, may indirectly access the flash memory 300 through the multipath accessible DRAM 400.

The first processor 100 may have an application function of performing a predetermined task. For example, the first processor 100 may provide user applications, such as data communications, electronic games or amusement, etc. The second processor 200 may have a MODEM function, for example, to perform modulation/demodulation of communication signals. However, the respective functions of the processors may vary.

The flash memory 300 may be a NOR flash memory having a NOR structure for a cell array configuration, or a NAND flash memory having a NAND structure for a cell array configuration. The NOR flash memory or the NAND flash memory is a nonvolatile memory for which memory cells, e.g., constructed of MOS transistors having floating gates, are formed in an array. Such nonvolatile memory stores data that is not deleted, even when power is turned off, such as boot codes of handheld instruments, preservation data, and the like.

In addition, the multipath accessible DRAM 400 functions as a main memory for a data process of the processors 100 and 200. As shown in FIG. 1, first and second ports 60 and 61, respectively connected to corresponding system buses B1 and B2, are inside the multipath accessible DRAM 400, so that the multipath accessible DRAM 400 may be accessed by the first and second processors 100 and 200 through two different ports. The multiple port configuration differs from a general DRAM configuration having a single port.

In the multipath accessible DRAM 400, four memory areas 10, 11, 12 and 13 constitute a memory cell array. For example, memory area 10 (bank A) may be accessed exclusively by the first processor 100 through the first port 60, and memory areas 12 and 13 (banks C and D) may be accessed exclusively by the second processor 200 through the second port 61. The memory area 11 (bank B) may be accessed by both the first and second processors 100 and 200 through first and second ports 60 and 61 as different ports. As a result, in the depicted memory cell array, bank B is a shared memory area, and banks A, C and D are dedicated memory areas, accessible only by one corresponding processor. The four memory areas 10-13 (banks A-D) may be constructed as a bank unit of the DRAM 400. Each bank may have memory storage of 64 Mb, 128 Mb, 256 Mb, 512 Mb or 1024 Mb, for example.

In the multiprocessor system of FIG. 1, the DRAM 400 and the flash memory 300 can be used in common without having to be assigned to every processor. Therefore, the system is less complicated and thus smaller, and the number of memories can be reduced.

The multipath accessible DRAM 400 shown in FIG. 1 is similar in functionality to a DRAM type memory known as OneDRAM™, provided by Samsung Electronics Co. Ltd. OneDRAM™ is a fusion memory chip that increases data processing speed between a communication processor and a media processor in a mobile device. In general, two processors require two memory buffers. However, the One-DRAM™ solution can route data between processors through a single chip, so two memory buffers are not required. OneDRAM™ reduces data transmission time between processors by employing a dual-port approach. A single One-DRAM™ module can replace at least two mobile memory chips, e.g., within a high-performance smart-phone or other multimedia rich-handset. As data processing speed between processors increases, OneDRAM™ reduces the number of chips, reduces power consumption by about 30 percent and reduces total die area coverage by about 50 percent. As a result, cellular phone speed may increase five times, battery life may be prolonged, and handset design may be slimmer, for example.

In a multiprocessor system sharing one flash memory and a multipath accessible DRAM, such as OneDRAM™, etc., boot codes of all processors, e.g., the processors 100 and 200, are stored in the flash memory 300. The second processor 200 directly accesses the flash memory 300 and starts initial booting of the system. However, the first processor 100, which is indirectly connected to the flash memory through a DRAM interface, cannot promptly read its boot code. Therefore, when boot time ends, the first processor 100 may have a halt state in operation due to the prolonged read time.

In initial booting, therefore, the second processor 200, determined to be a master processor, applies a reset signal RESET to a reset pin of the first processor 100, determined to be a slave processor, using a host interface, thereby controlling the booting of the slave processor 100. That is, according to the structure indicated by FIG. 1, the master processor 200 starts its own booting and also applies a reset enable signal to the slave processor 100 through host interface line 202. Then, when the master processor 200 has completed booting, the master processor 200 applies a reset disable signal to the slave processor 100 in order to disable the reset signal that was applied to the slave processor 100. The slave processor 100 starts booting upon receipt of the reset disable signal.

The reset control described above requires reset line 202 connected between the processors and the reset to be performed through a host interface between the processors. Thus, the master processor 200 must keep controlling the reset of the slave processor 100 during system booting. Furthermore, there must be both a DRAM interface and a host interface in the multiprocessor system, which reduces operating speed. Thus, improved reset control for initial booting of a multiprocessor system is needed.

Accordingly, embodiments of the invention provide a semiconductor memory device capable eliminating the need for boot time control over a slave processor during initial booting of a system, and avoiding a halt state of operation in the slave processor. Also, a reset signal line between multiple processors is not needed. Embodiments may provide a DRAM, e.g., a OneDRAM™, having a processor reset function and a processor reset control method.

According to an embodiment of the invention, a semiconductor memory device is provided for use in a multiprocessor system. The semiconductor memory device includes a shared memory area and a reset signal generator. The shared memory area is accessible by processors of the multiprocessor system through different ports, the shared memory area being assigned to a portion of a memory cell array. The reset signal generator is configured to provide a reset enable signal to a processor, predetermined as a slave processor among the plurality of processors, for a predetermined time after an initial booting of the multiprocessor system, and to provide a reset disable signal to the slave processor after the predetermined time lapses.

The reset enable signal may be generated in the semiconductor memory device, and the reset disable signal may be generated in the semiconductor memory device under control of a processor, predetermined as a master processor among the multiple processors.

The semiconductor memory device may include a DRAM type memory used in common by the processors, and the multiprocessor system may include a nonvolatile semiconductor memory device for storing a boot code. The reset signal generator may include an externally controllable mode register set circuit or extended mode register set circuit. Also, the reset enable signal and the reset disable signal may be generated in the semiconductor memory device.

The reset signal generator may include a mode register set circuit configured to output a register setting signal in response to an external signal; a latch configured to latch the register setting signal applied through an input node; a switching transistor configured to discharge the input node in response to a power-up reset related signal; and a driver configured to drive an output signal of the latch and to output the output signal as one of the reset enable signal or the reset disable signal. The reset signal generator may include a power voltage sensing unit configured to sense a source voltage in the initial booting of the multiprocessor system, and to output a power-up reset related signal; an address signal level sensing unit configured to sense a level of an address signal output through an address buffer, and to output an operation state signal; a gating unit configured to gate the power-up reset related signal and the operation state signal, and to output a gating output signal; and a signal output unit configured to drive the gating output signal of the gating unit, to delay the power-up reset related signal and to drive the delayed power-up reset related signal in order to internally generate one of the reset enable signal or the reset disable signal.

The semiconductor memory device may further include an internal register accessible in response to an address of the shared memory area to provide an interface function among the processors. The internal register may be located outside the memory cell array. The memory cell array may further include dedicated memory areas, each dedicated memory area being accessible by one processor of the multiple processors.

According to another embodiment of the invention, a multiprocessor system includes at least two processors, a nonvolatile semiconductor memory and a semiconductor memory device. Each processor is configured to perform a predetermined task, and at least one of the processors is predetermined to be a slave processor. The nonvolatile semiconductor memory is connected to one of the processors, and stores boot codes corresponding to the processors. The semiconductor memory device includes a shared memory area, assigned to a portion of a memory cell array, and a reset signal generator. The shared memory area provides a data interface operation between the processors and is accessible in common by the processors through different ports. The reset signal generator provides a reset enable signal to the slave processor for a predetermined time after an initial booting of the system and provides a reset disable signal to the slave processor after the predetermined time lapses.

The nonvolatile semiconductor memory device may include a NAND flash memory. Also, at least one of the processors may be predetermined to be a master processor, where the reset enable signal is generated in the semiconductor memory device and the reset disable signal is generated in the semiconductor memory device under control of the master processor.

The reset signal generator may include an externally controllable mode register set circuit or extended mode register set circuit. The reset enable signal and the reset disable signal may be generated in the semiconductor memory device.

The reset signal generator may include a mode register set circuit for outputting a register setting signal in response to an external signal; a latch for latching the register setting signal applied through an input node; a switching transistor for discharging the input node in response to a power-up reset related signal; and a driver for driving an output signal of the latch and outputting the output signal as the reset enable signal or reset disable signal. The reset signal generator may include a power voltage sensing unit for sensing a source voltage in the initial booting of the system, and outputting a power-up reset related signal; an address signal level sensing unit for sensing a level of address signal output through an address buffer, and outputting an operation state signal; a gating unit for gating the power-up reset related signal and the operation state signal, and outputting a gating output signal; and a signal output unit for driving the gating output signal of the gating unit, delaying and driving the power-up reset related signal, thereby generating the reset enable signal or reset disable signal without assistance from an external processor.

According to another embodiment of the invention, a method is provided for controlling processor reset during an initial booting of a multiprocessor system, including first and second processors, a nonvolatile semiconductor memory and a volatile semiconductor memory, and for performing a data interface of the first and second processors through the volatile semiconductor memory. The method includes applying a reset enable signal, generated through a reset pin of the volatile semiconductor memory, to the first processor for a time period after the initial booting of the multiprocessor system starts, during which a booting operation of the second processor is performed; and applying a reset disable signal through the reset pin of the volatile semiconductor memory after the booting operation of the second processor is completed, the reset disable signal releasing the reset enable signal to the first processor and enabling a booting operation of the first processor to be performed without a halt caused by a boot time-over.

The reset enable signal may be generated in the volatile semiconductor memory device, and the reset disable signal may be generated under control of the second processor by a mode register set circuit. Alternatively, the reset disable signal may be generated in the volatile semiconductor memory device in response to a state of power-up reset related signal.

In the device and method according to various embodiments, a boot time-over of a processor can be prevented during an initial booting of a multiprocessor system, thus avoiding a halt state in the processor operation. In addition, a reset of the processor may be performed rapidly by a reset enable signal generated in a semiconductor memory device itself, a reset signal line between processors is not needed, and a reset of the processor may be controlled by a multipath accessible semiconductor memory device.

BRIEF DESCRIPTION OF THE DRAWINGS

The embodiments of the present invention will be described with reference to the attached drawings, which are given by way of illustration only and thus are not limiting of the present invention, wherein.

DETAILED DESCRIPTION

Figure 1:
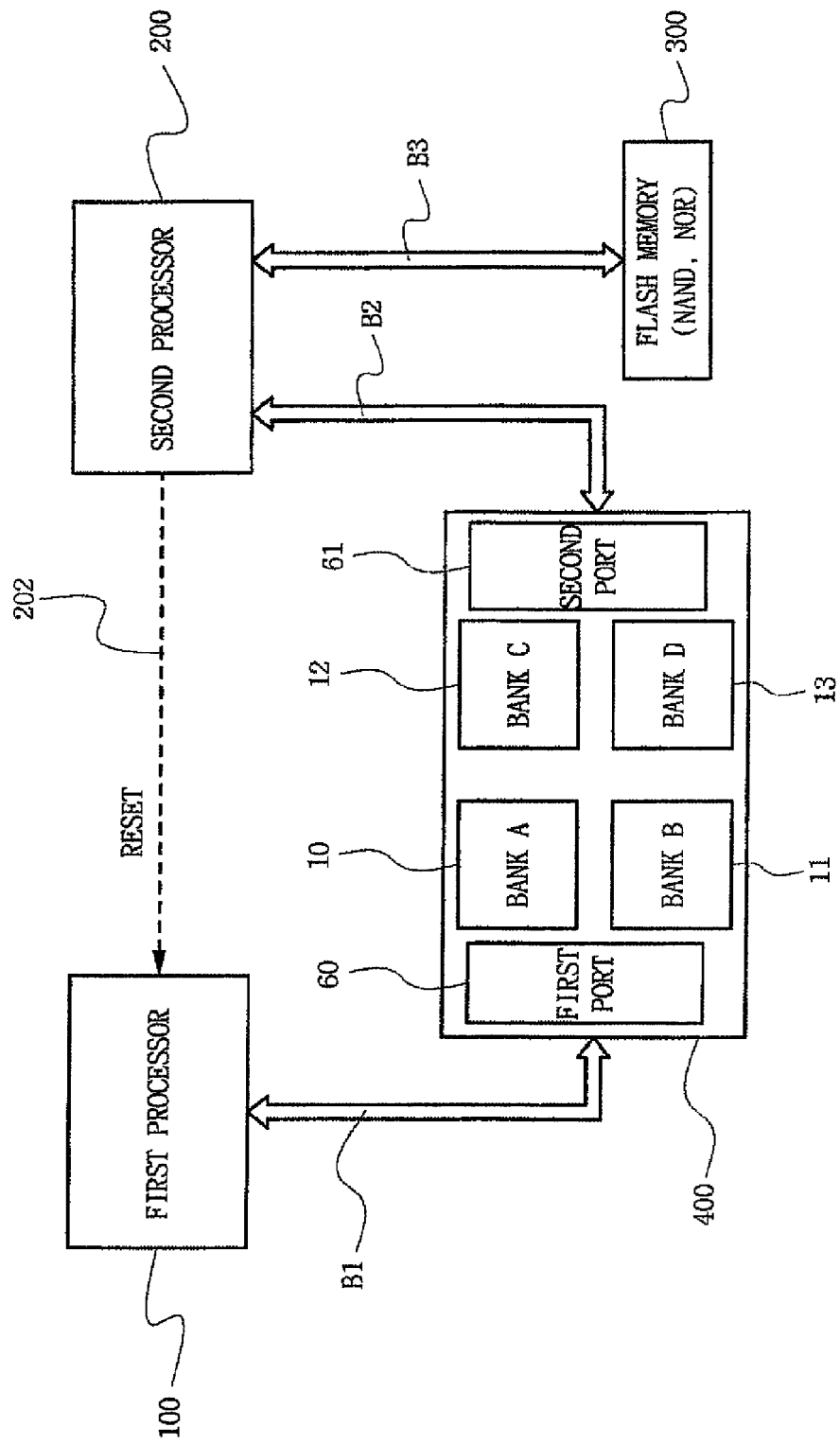
FIG. 1 is a block diagram of a conventional multiprocessor system.

The present invention will now be described more fully with reference to the accompanying drawings, in which exemplary embodiments of the invention are shown. The invention may, however, be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art, and will not be interpreted in an idealized or overly formal sense unless expressly so defined herein.

Exemplary embodiments of the present invention are more fully described below with reference to the accompanied drawings. This invention may, however, be embodied in different forms and should not be construed as being limited to the exemplary embodiments set forth herein; rather, these exemplary embodiments are provided so that this disclosure is thorough and complete, and conveys the concept of the invention to those skilled in the art. For purposes of clarity, detailed descriptions of other examples, publication methods, procedures, general dynamic random access memories and circuits as known functions and systems have been omitted.

A multipath accessible semiconductor memory device having a processor reset function and a processor reset control method are described according to illustrative embodiments, referring to the accompanying drawings, as follows.

Typical problems relating to processor reset control in a multiprocessor system are again briefly described for a more thorough understanding of the invention. For example, in a multiprocessor system including at least two processors, a dynamic random access memory (DRAM) connected between the processors is accessed in common by the processors and has a shared memory area. A nonvolatile memory, e.g., a flash memory, is directly coupled to one of the processors and stores a boot code for both processors. Because all boot codes for the processors are stored in the flash memory, a processor determined to be the master processor is first booted and a processor determined to be the slave processor is booted in sequence.

In this case, the slave processor is powered up in coincidence with the master processor, and thus a respective read operation to read corresponding boot codes begins. In this time interval, however, the master processor is also reading its boot code. Therefore, a "boot time-over" state may occur in the slave processor, causing a halt in operation of the slave processor. Furthermore, in the conventional art, such as the system depicted in FIG. 1, a host interface between the master and slave processors must be used and a reset line must be specifically adapted.

Figure 2:
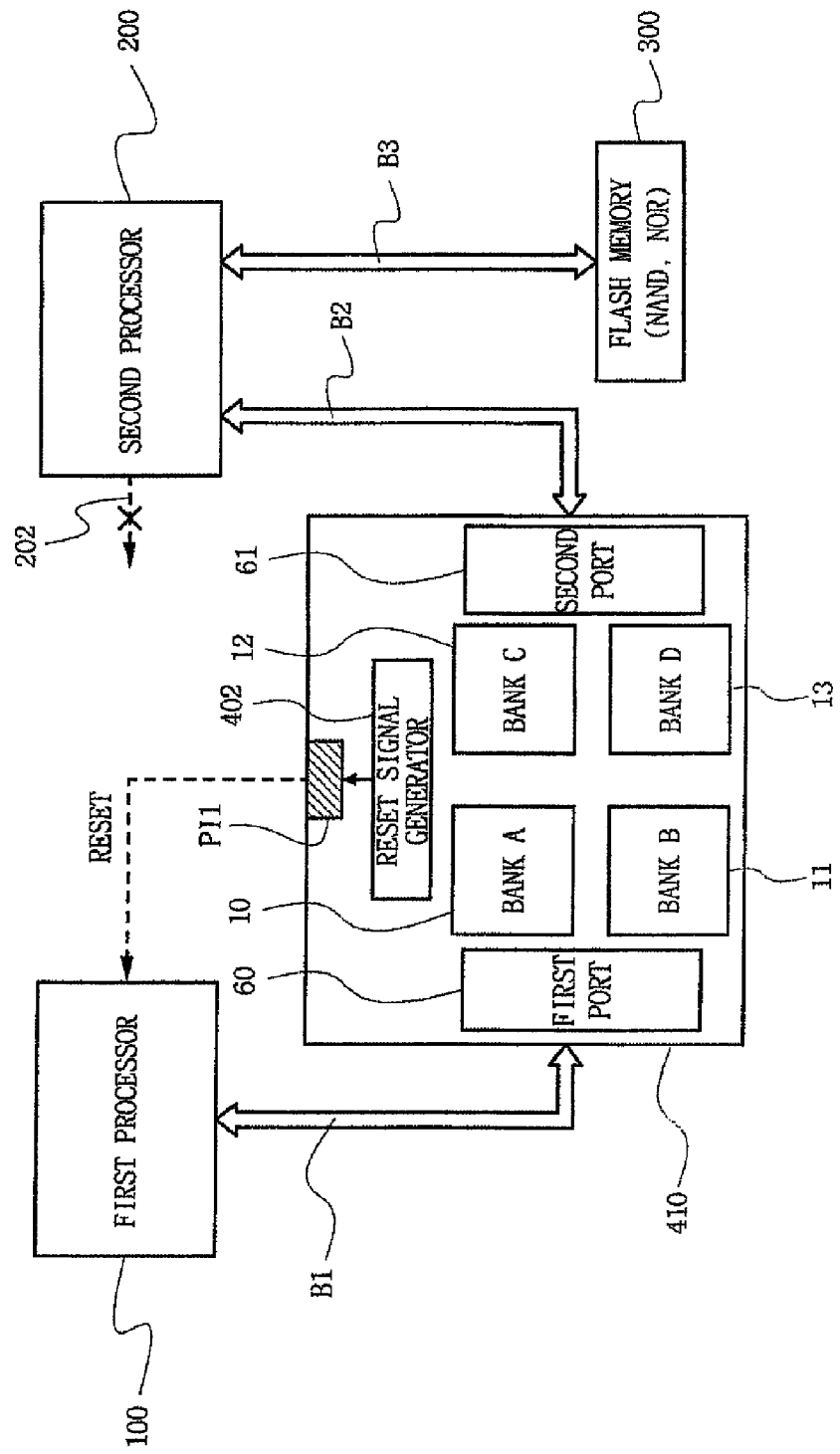
FIG. 2 is a block diagram of a multiprocessor system employing a memory having a reset function, according to an exemplary embodiment of the invention.

To address issues of the conventional art, an exemplary multiprocessor system having a multipath accessible semiconductor memory device 410 for controlling processor reset is provided, as shown in FIG. 2.

FIG. 2 is a block diagram of a multiprocessor system including a memory having a reset function, according to an exemplary embodiment of the invention. The multiprocessor system includes at least two processors, first processor 100 and second processor 200, a nonvolatile semiconductor memory 300 and a semiconductor memory device 410, which may be a DRAM, for example. The processors 100 and 200 respectively perform predetermined tasks. The nonvolatile semiconductor memory 300 is connected to one of the processors (e.g., the second processor 200) and stores boot codes for the first and second processors 100 and 200 in nonvolatile memory.

The semiconductor memory device 410 includes a memory cell array, indicated by memory areas 10, 11, 12 and 13 (banks A-D). In the semiconductor memory device 410, configurations of the four memory areas 10, 11, 12 and 13, and first and second ports 60 and 61, may be the same or similar to those described with respect to the conventional art. A shared memory area 11 (bank B), in which a data interface between the processors is performed, is accessible in common by the processors through different ports (e.g., first and second ports 60 and 61). The shared memory area 11 is assigned to a portion of the memory cell array.

The semiconductor memory device 410 also includes a reset signal generator 402 that provides a reset enable signal to the first processor 100, predetermined to be a slave processor among the processors, for a given time after an initial booting of the system. The reset signal generator 402 also provides a reset disable signal to the slave processor 100 after a lapse of given time. As shown in FIG. 2, a reset line 202 between the first and second processors 100 and 200 is not required. The reset operation of the first processor 100 is controlled by a reset signal applied through a reset pin PI1 of the semiconductor memory device 410.

Figure 3:
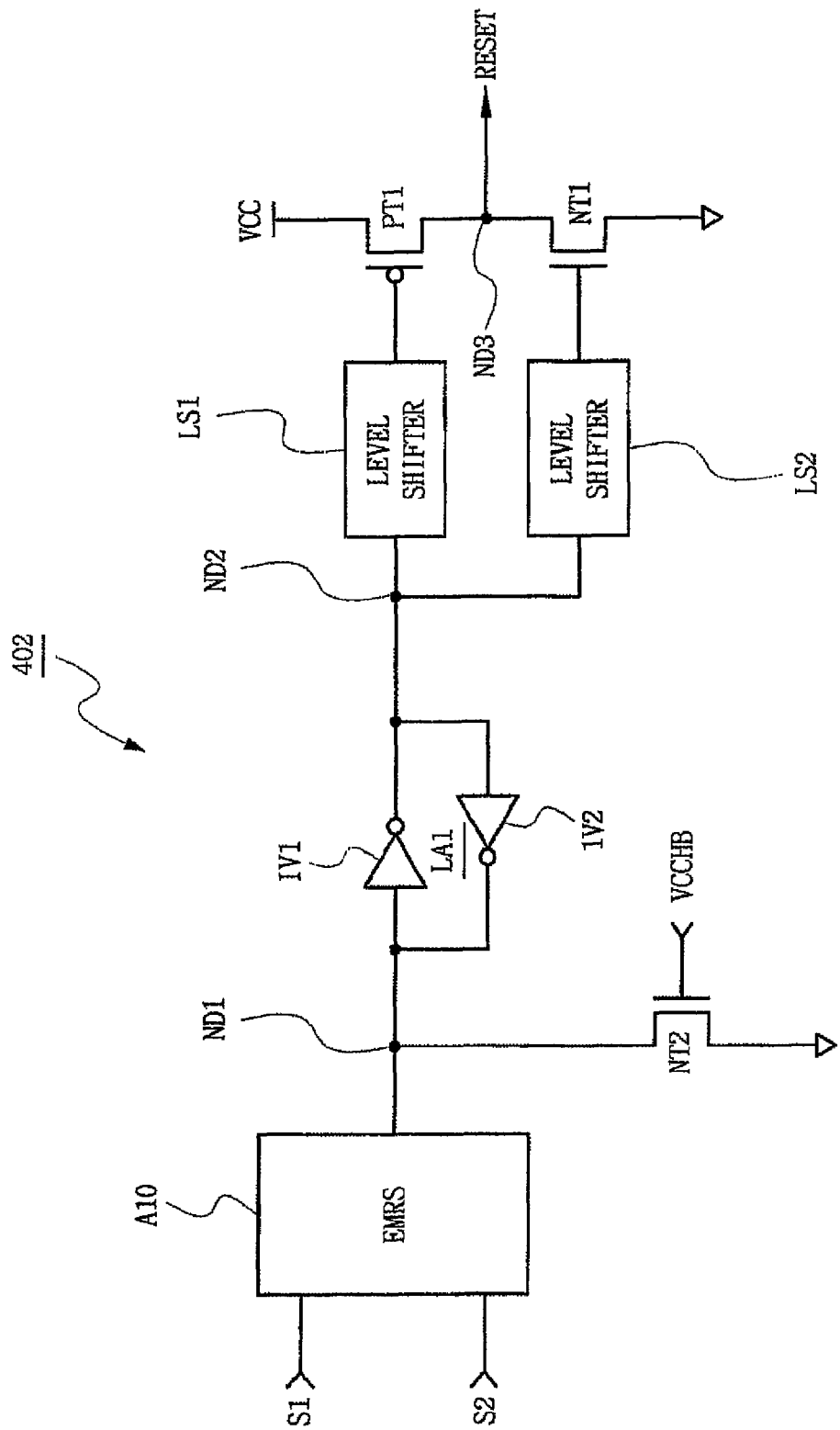
FIG. 3 is a circuit diagram illustrating a reset signal generator shown in FIG. 2, according to an exemplary embodiment of the invention.
Figure 4:
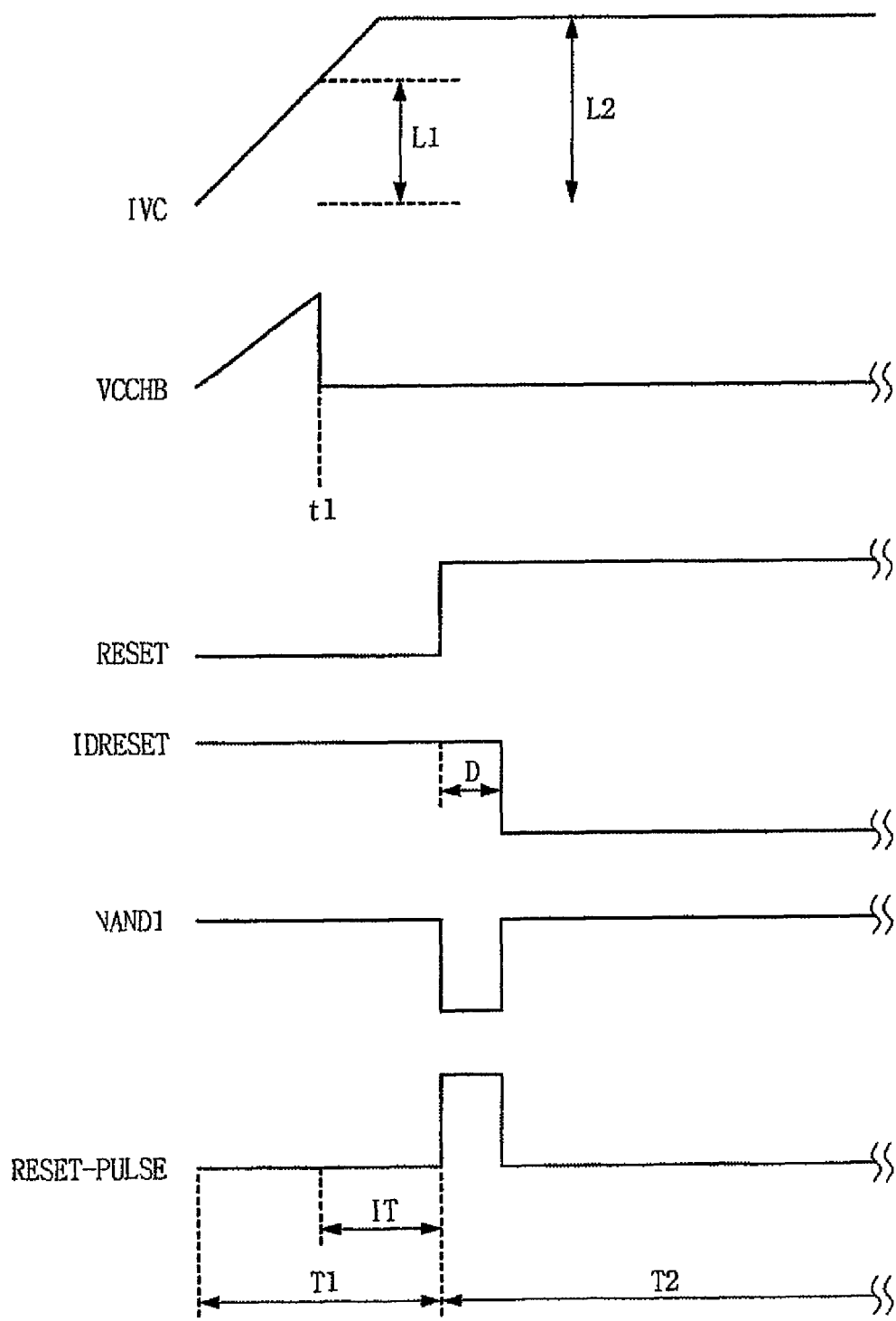
FIG. 4 are timing diagrams illustrating operation of FIG. 3, according to an exemplary embodiment of the invention.

FIG. 3 illustrates a circuit for an exemplary embodiment of the reset signal generator 402, shown in FIG. 2. FIG. 4 is a timing diagram illustrating an exemplary operation of the reset signal generator 402 shown in FIG. 3.

Referring to FIG. 3, the reset signal generator 402 includes a mode register set circuit or extended mode register set (EMRS) circuit A10 for outputting a register setting signal in response to external signals S1 and S2, a latch LA1 for latching the register setting signal applied through an input node ND1, a switching transistor NT2 for discharging the input node ND1 in response to a power-up reset-related signal VCCHB, and drivers PT1 and NT1 for driving an output signal of the latch LA1 and outputting it as the reset enable signal or reset disable signal. Level shifters LS1 and LS2 may be included to provide level-shifted signals to input terminals of the drivers PT1 and NT1.

An exemplary circuit operation of FIG. 3 is described with reference to FIG. 4. During an initial booting operation of the system, a gradually increasing external voltage is applied. Thus, a level of an internal voltage IVC (e.g., generated from an internal voltage generator of the semiconductor memory device 410) appears as the IVC waveform shown in FIG. 4. Meanwhile, in a power-up reset circuit of the semiconductor memory device 410, a power-up reset signal and a power-up reset bar signal are output during booting of the system. Waveform VCCHB of FIG. 4 indicates the power-up reset bar signal. The power-up reset bar signal VCCHB is characterized by increasing along with a level of the internal voltage IVC and then decreasing to a low level at time point t1. That is, the power-up reset bar signal VCCHB appears as a logic high level in an initial booting, and then is maintained as a logic low level after time point t1 when the level of the internal voltage IVC reaches a voltage level L1.

The initial booting of the system occurs before the second processor 200 completes its booting operation, and so the external signals S1 and S2 can not be provided to the mode register set circuit A10 in FIG. 3. The input node ND1 of FIG. 3 is discharged as a ground level, 0 V, by a turn-on operation of the NMOS transistor NT2. Then, a latch output terminal ND2 of the latch LA1 becomes a high level. The level shifters LS1 and LS2 may shift the latch output to a predetermined level. For example, the level shifters LS1 and LS2 may amplify an internal low determination level and generate an external high voltage level. When the latch output terminal ND2 has a high level, the PMOS transistor PT1 is turned off and the NMOS transistor NT1 is turned on. Then, a reset signal RESET having a low level is output through an output node ND3. For purposes of description, a reset signal RESET having a low level is called a reset enable signal and a reset signal RESET having a high level is called a reset disable signal.

When the reset enable signal RESET output from the reset signal generator 402 is output from the semiconductor memory device 410 through the reset pin PI1, the first processor 100 enters a reset enable state. That is, the first processor 100, which has been determined to be the slave processor, receives the reset enable signal RESET and thus does not immediately start its booting operation when the system is initially booted. Rather, the first processor 100 enters a reset state. Accordingly a "boot time-over" does not occur in the slave processor 100.

The reset state of the first processor 100 lasts until an output of the mode register set circuit A10 shown in FIG. 3 appears as a high level. Consequently, the second processor 200, which has been determined to be the master processor, completes its own booting operation and provides the external signals S1 and S2 with a predetermined condition. The external signal S1, S2 may be a mode register set signal or extended mode register set signal, for example, and may include single or multiple bits.

When the external signals S1 and S2 are applied, an output of the mode register set circuit A10 is provided at a high level, and the power-up reset bar signal VCCHB is provided at a low level. Therefore, the NMOS transistor NT2 is turned off and the input node ND1 is maintained at a high level. As shown in the reset waveform RESET of FIG. 4, a reset signal having a high level is output from the output node ND3 of FIG. 3 after a time interval T1 and this becomes the reset disable signal. Then, the first processor 100 of FIG. 2 is released from the reset state and begins its booting operation. Thus, a reset of the first processor 100 is controlled by the multipath accessible semiconductor memory device 410, thereby eliminating the reset line 202 referred to in FIG. 1.

Referring to FIG. 3, the reset enable signal is generated by the multipath accessible semiconductor memory device 410, and the reset disable signal is generated by the multipath accessible semiconductor memory device 410 under control of the second processor 200.

In an embodiment, the first processor 100 receives a reset pulse RESET-PULSE instead of reset signal RESET. In this embodiment, an inverter, a delay and NAND gate (not shown in FIG. 3) may be added to the output node ND3 shown in FIG. 3. Then, waveforms IDRESET and NAND1 of FIG. 4 are generated, in sequence, and the reset pulse RESET-PULSE is obtained.

In the circuit of FIG. 3, a halt state in an operation caused by a "boot time-over" state does not occur in the slave processor 100. Also, a host interface for performing reset control between processors and a reset line between processors are not needed.

In another exemplary embodiment, the multipath accessible semiconductor memory device 410 generates a reset enable signal and a reset disable signal even without receiving a mode register set signal or an extended mode register set signal. The technology of generating a reset disable signal without assistance of a master processor provides a high operation speed and simplified control, lessening a control load of the master processor.

Figure 5:
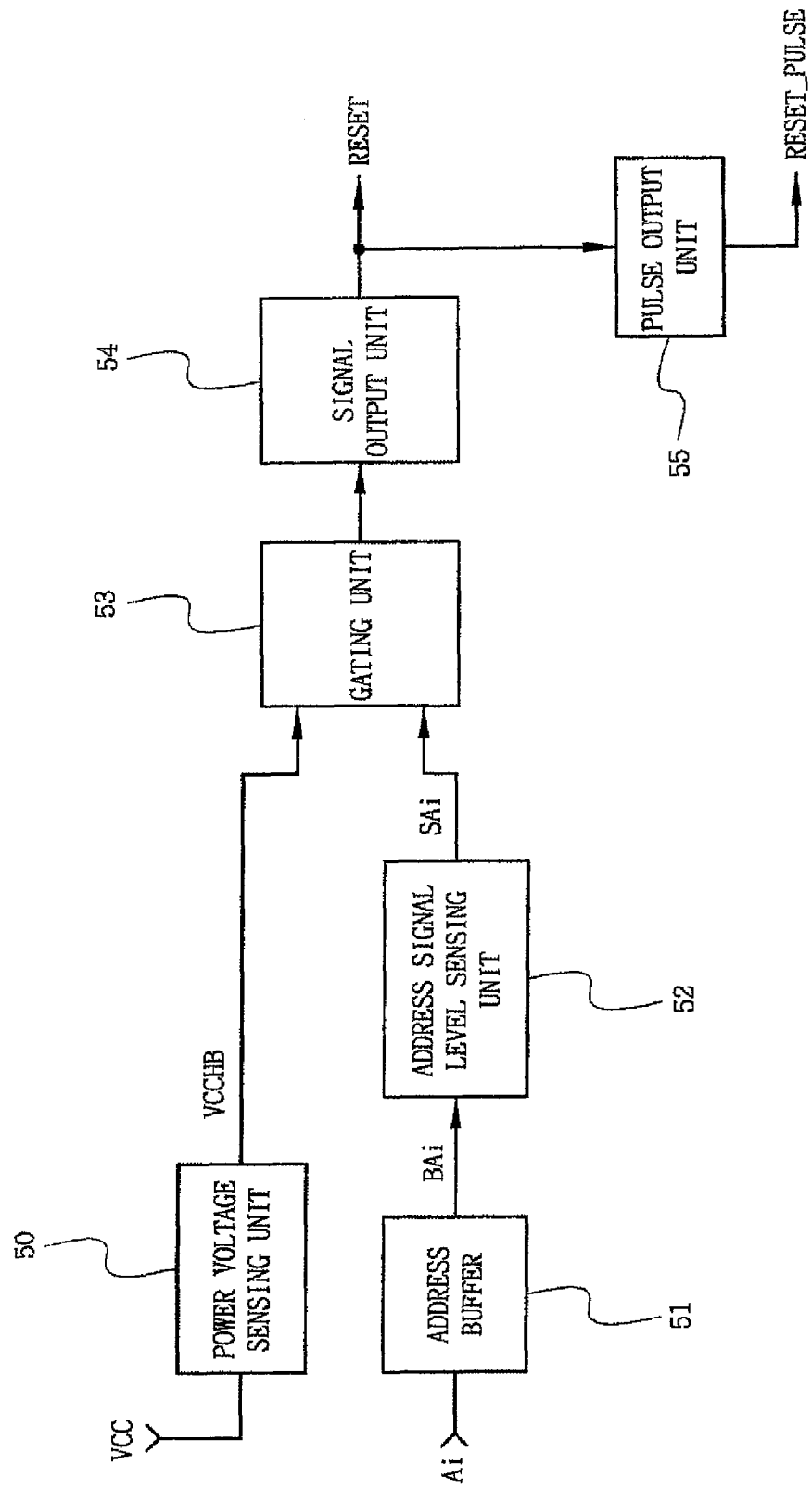
FIG. 5 is a block diagram illustrating a reset signal generator shown in FIG. 2, according to another exemplary embodiment of the invention.

FIG. 5 is a block diagram of reset signal generator 402 shown in FIG. 2, according to another exemplary embodiment of the invention. With reference to FIG. 5, a gating unit 53 gates a power-up reset related signal (e.g., VCCHB) and an operation state signal SAi, and outputs a gating output signal. A power voltage sensing unit 50 senses a source voltage VCC in an initial booting of the system, and outputs the power-up reset related signal VCCHB. An address signal level sensing unit 52 senses a level of address signal BAi output through an address buffer 51, and outputs the operation state signal SAi. A signal output unit 54 drives a gating output signal of the gating unit 53, and delays the power-up reset related signal VCCHB and then drives it, thus generating the reset enable signal or reset disable signal without the assistance of an external processor.

Figure 8:
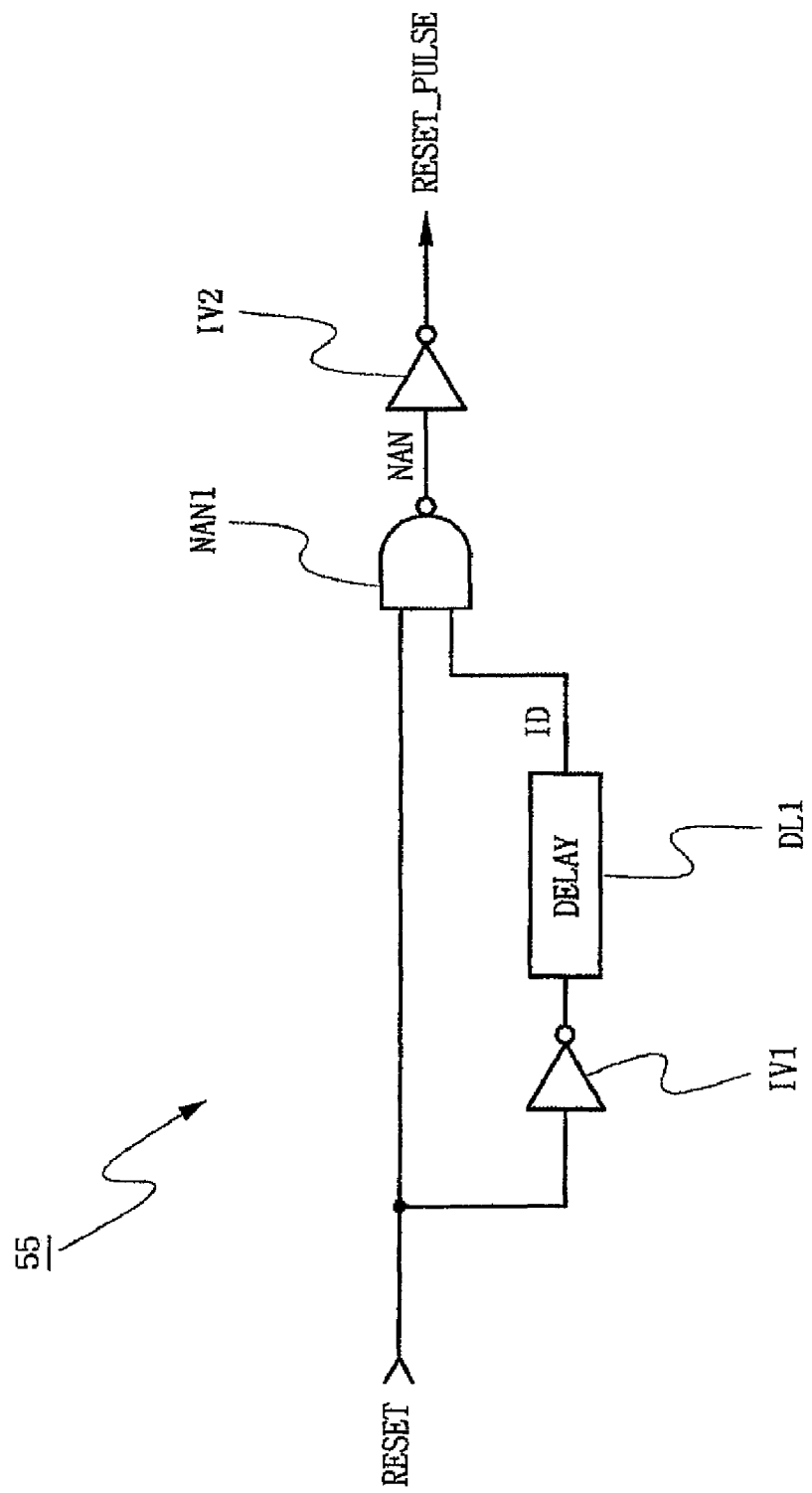
FIG. 8 is a circuit diagram illustrating a pulse output unit of FIG. 5, according to an exemplary embodiment of the invention.

In FIG. 5, to obtain reset pulse RESET-PULSE, a pulse output unit 55 may be included. The pulse output unit 55 can be realized as illustrated in the exemplary embodiment shown in FIG. 8, which is a detailed circuit of the pulse output unit 55. The pulse output unit 55 includes an inverter IV1, delay DL1, NAND gate NAN1 and inverter IV2. The reset pulse RESET-PULSE can be generated as illustrated in FIGS. 3 and 4. The pulse output unit 55 may include other logic gates.

Figure 6:
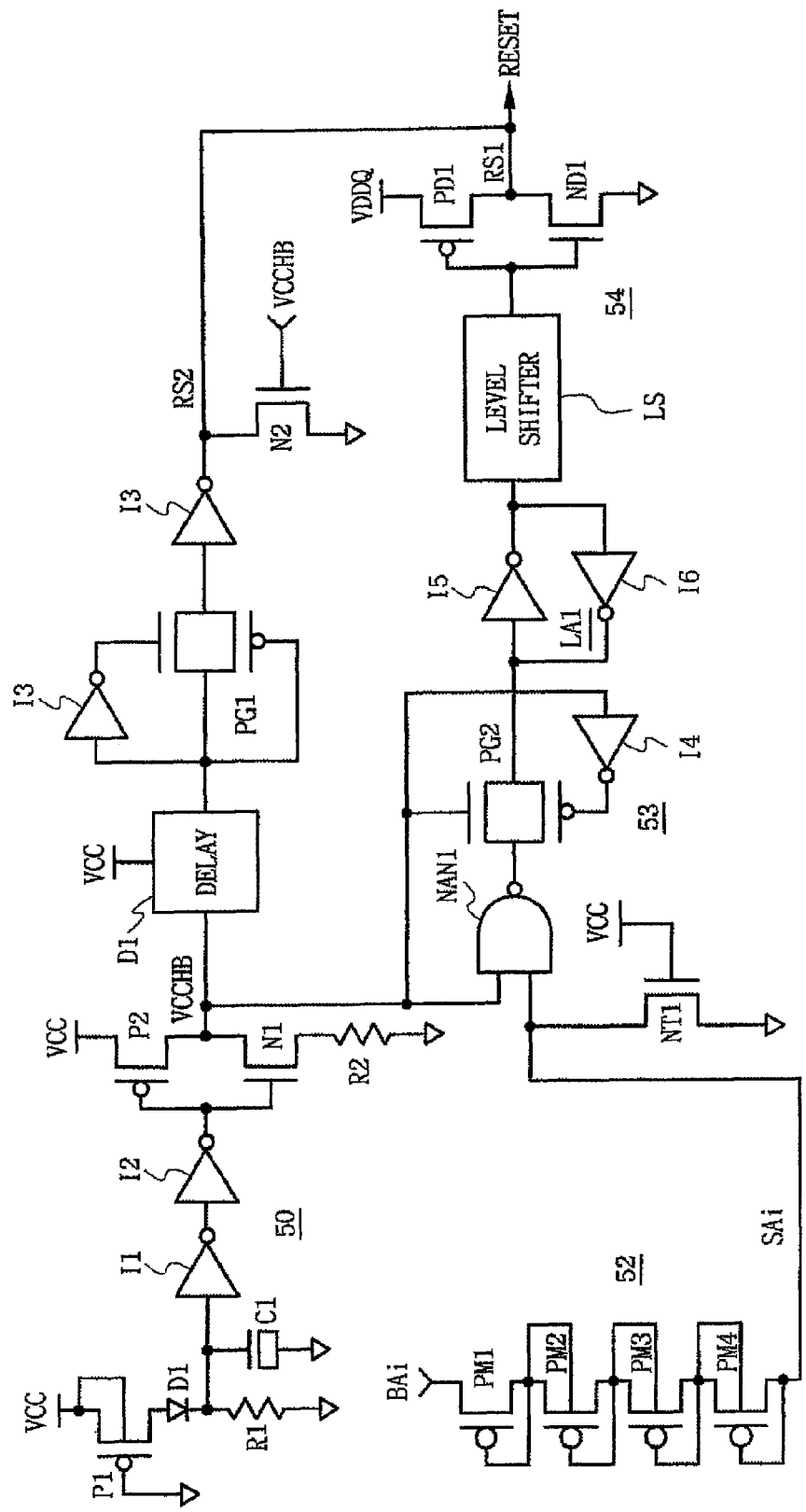
FIG. 6 is a circuit diagram illustrating a first embodiment of FIG. 5.

An exemplary operation of FIG. 5 is described with reference to FIG. 6. FIG. 6 illustrates a circuit diagram of a first embodiment of FIG. 5, and reference numbers referred to in FIG. 5 are applied to FIG. 6. For example, the address signal level sensing unit 52 of FIG. 5 includes four PMOS transistors PM1, PM2, PM3 and PM4 in FIG. 6. Further, the power voltage sensing unit 50 of FIG. 5 includes a PMOS transistor P1, diode D1, resistor R1, capacitor C1, inverters I1 and I2, PMOS transistor P2, NMOS transistor N1 and resistor R2, as shown in FIG. 6.

The power voltage sensing unit 50 receives power source voltage VCC and generates the power-up reset bar signal VCCHB. When the power source voltage VCC is lower than a given level as shown in FIG. 4, for example, the power-up reset bar signal VCCHB is output at a high level, and when the power source voltage VCC is higher than a given level, the power-up reset bar signal VCCHB is maintained at a low level.

More particularly, PMOS transistor P1, which has a source to which power source voltage VCC is applied, maintains a turn-on state. A level of voltage output through a drain of the PMOS transistor P1 is applied to an anode of diode D1, and is dropped corresponding to a level of built-in voltage of the diode, and then output to a cathode. An output voltage in the cathode of diode is applied to resistor R1 and capacitor C1. The capacitor C1 begins charging with the output voltage in the cathode of the diode D1, and the output voltage in the cathode of the diode D1 is buffered by inverters I1 and I2 constituting an inverter chain. In an initial booting of the system, an output of the inverter chain is output at a low level, so a PMOS transistor P2 is turned on and the power-up reset bar signal VCCHB is output at a high level. Meanwhile, when a level of power source voltage VCC increases more than a given level, an output of the inverter chain is at a high level, so the NMOS transistor N1 is turned on and the power-up reset bar signal VCCHB is output at a low level.

An output address signal BAi output from the address buffer 51 is determined higher than a level of power source voltage VCC in an initial booting of the system. In other words, in normal operation, the address buffer 51 outputs an output address signal BAi corresponding to a level of the power source voltage VCC. However, during initial booting, the address buffer 51 outputs an output address signal BAi at a higher level than the level of the power source voltage VCC. Accordingly, the address signal level sensing unit 52 of FIG. 6 provides operation state signal SAi applied to NAND gate NAN1 at a high level in the initial booting of the system, and after a lapse of given time period, provides the operation state signal SAi at a low level. For example, when during the initial booting, the output address signal BAi is output with a level of 8V, a voltage of the signal is reduced by the sum of threshold voltages of the four PMOS transistors PM1-PM4 and applied to the NAND gate NAN1, thus becoming 8V-4Vtp. For example, when a threshold voltage of one PMOS transistor (PM1-PM4) is about 0.7V, a total voltage drop corresponding to 2.8V is generated and a voltage of 5.2 V is output.

In the NAND gate NAN1, logic levels of two input terminals become high during the initial booting, and thus the NAND gate NAN1 outputs a low level to an output terminal. A low level output from the NAND gate NAN1 is applied as an input of latch LA1 as a transmission gate PG2 is turned on. An output of the latch LA1 becomes a high level, and is level-shifted by the level shifter LS, turning on NMOS transistor ND1. Thus, in a first reset output terminal RS1, reset enable signal RESET, shown in waveform of FIG. 4, is output at a low level. In this case, the power-up reset bar signal VCCHB has a high level, and thus NMOS transistor N2 is turned on, and a second reset output terminal RS2 is a low level.

In contrast, when a level of the power source voltage VCC increases to a predetermined level, the power-up reset bar signal VCCHB is provided at a low level. Then, an output of the NAND gate NAN1 becomes a high level. At this time, the transmission gate PG2 enters a turn-off state, thus the output does not normally occur in the first reset output terminal RS1. However, in this case, a transmission gate PG1 is turned on and an output of delay D1 is provided to an input terminal of inverter I3. Thus, a reset disable signal RESET having a high level is output, e.g., as shown in by the RESET waveform of FIG. 4. Accordingly, as a delay time of the delay D1 is appropriately determined, a reset enable section of the first processor 100 is determined corresponding to the determined time.

As illustrated in FIG. 6, the reset enable signals and the reset disable signals can be generated in the semiconductor memory device 402 itself. This example therefore shows a semiconductor memory independently controlling a processor without depending on a mode register set signal.

Figure 7:
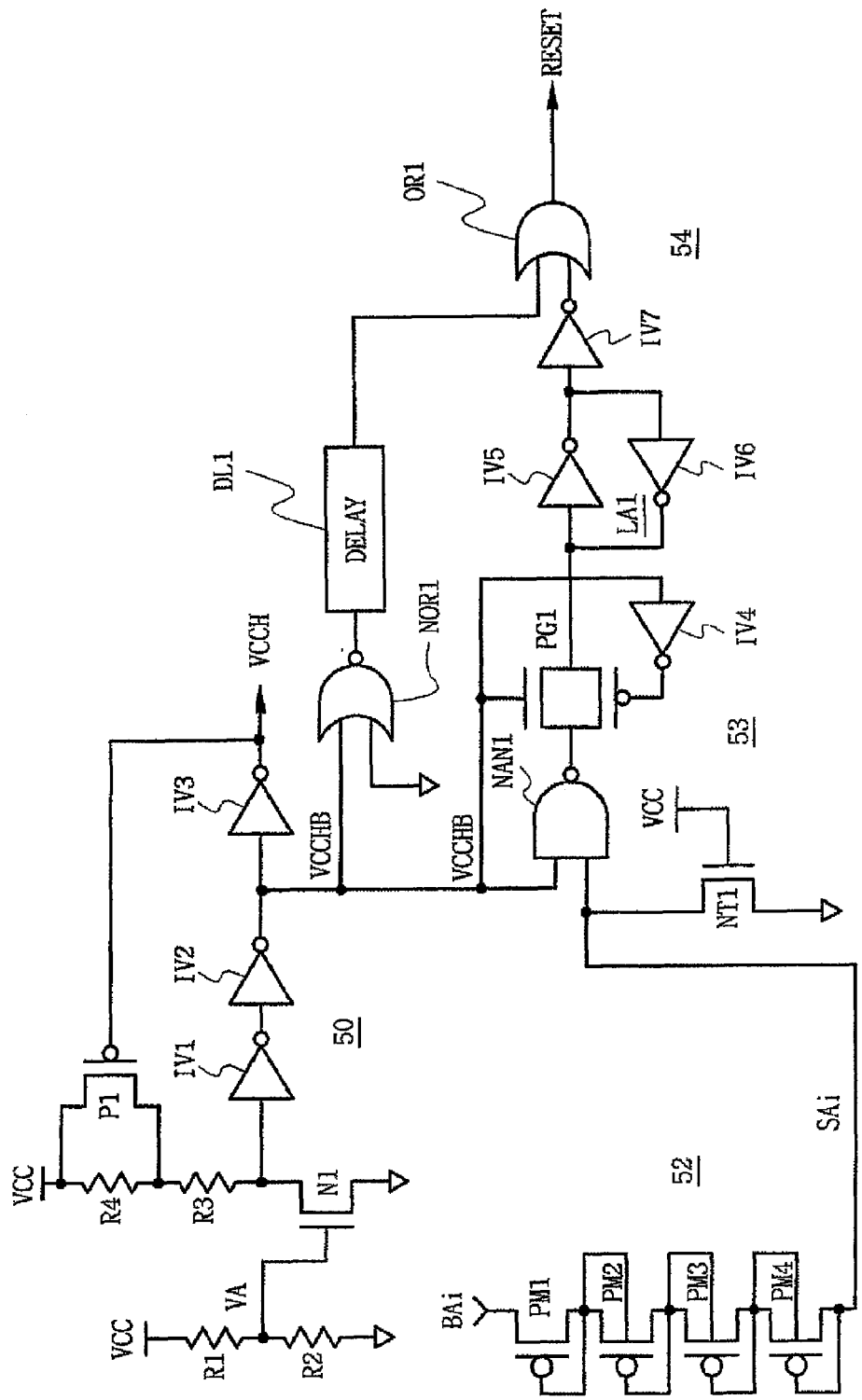
FIG. 7 is a circuit diagram illustrating a second embodiment of FIG. 5.

FIG. 7 illustrates a circuit diagram of a second embodiment of FIG. 5. As in FIG. 6, FIG. 7 illustrates a circuit arranged to generate the reset enable signal and the reset disable signal in the semiconductor memory device 410, itself.

In the power voltage sensing unit 50 of FIG. 7, the principle of generating power-up reset bar signal VCCHB is essentially the same as in FIG. 6, although the components are different, the operation of which would be apparent to one of ordinary skill in the art based on the depicted configuration. Also, in FIG. 7, an internal operation of outputting reset enable signal RESET at a low level through an OR gate OR1 is essentially the same as in FIG. 6. However, unlike FIG. 6, outputting reset disable signal RESET of a high level through delay DL1 is performed by NOR gate NOR1 and delay DL1. Accordingly, signal output unit 54 shown in FIGS. 6 and 7 drives a gating output signal of the gating unit 53, delays the power-up reset related signal, and then drives it, thereby generating the reset enable signal or reset disable signal without assistance of an external processor.

Figure 9:
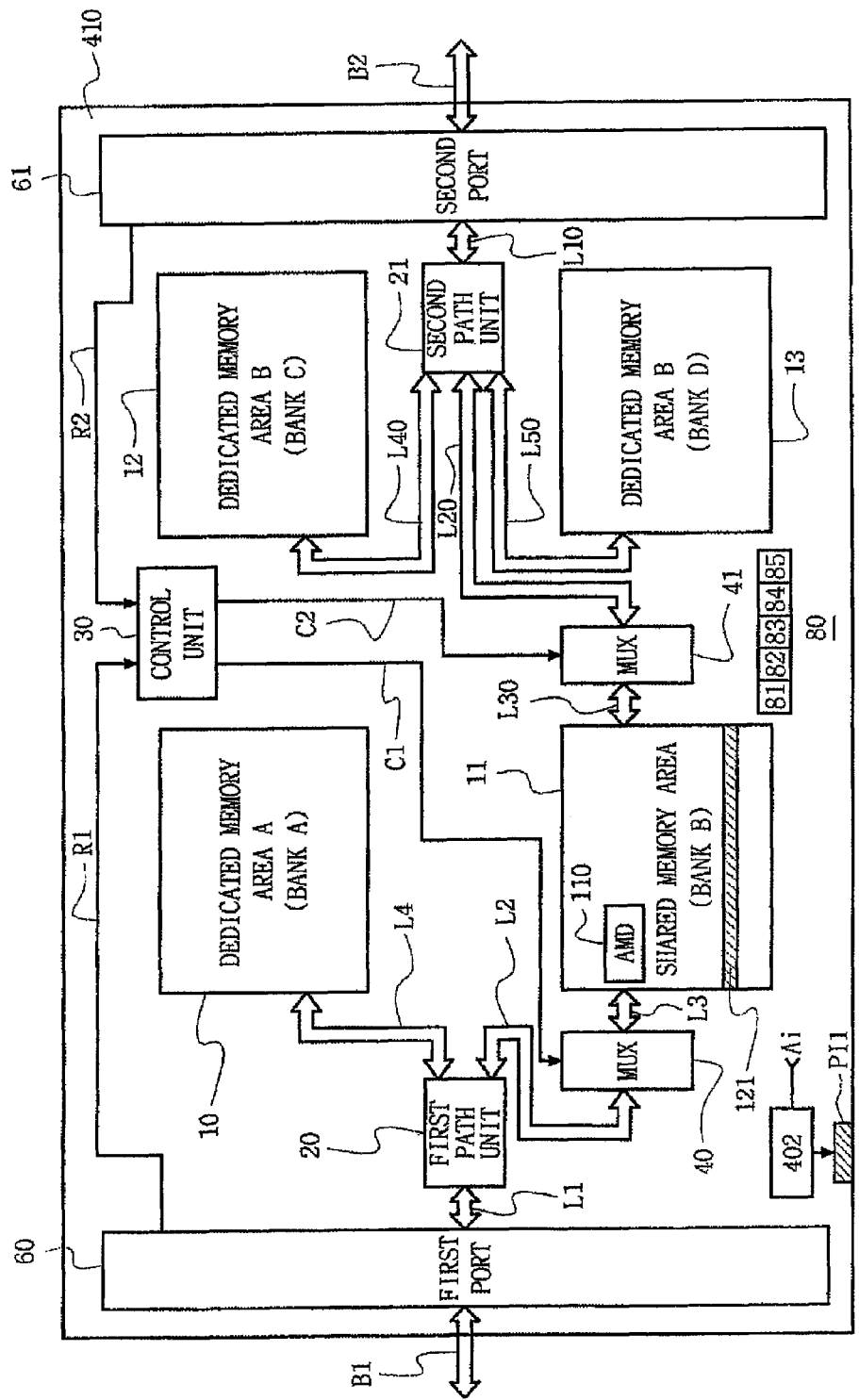
FIG. 9 is a block diagram illustrating a multipath accessible DRAM shown in FIG. 2, according to an exemplary embodiment of the invention.

FIG. 9 is a block diagram of the multipath accessible semiconductor memory device 410 shown in FIG. 2, according to an exemplary embodiment. Referring to FIG. 9, four memory areas 10, 11, 12 and 13 constitute a memory cell array, and an internal register 80 is outside the memory cell array. Further, first and second path units 20 and 21, multiplexers 40 and 41, and control unit 30 are outside the memory cell array. Though not limited, the illustrative semiconductor memory device 410 shown in FIG. 9 has two independent ports. For purposes of description, a first port 60 is connected to bus B1 and a second port 61 is connected to bus B2. The buses B1 and B2 may be a general purpose input/output (GPIO) line, for example.

In FIG. 9, a dedicated memory area 10 (bank A) is accessible by the first processor 100 of FIG. 2 through the first port 60, and dedicated memory areas 12 and 13 (banks C and D) are accessible by the second processor 200 of FIG. 2 through the second port 61. Shared memory area 11 (bank B) is accessible by both the first and second processors 100 and 200 through the first and second ports 60 and 61, respectively. That is, in the memory cell array, memory area 11 is assigned as the shared memory area, and memory areas 10, 12 and 13 are assigned as the dedicated memory areas, accessible only by one corresponding processor.

The shared memory area 11 may include a storage table area 110 that stores address map data of flash memory 300 shown in FIG. 2. In FIG. 9, the internal register 80 functions as an interface between the first and second processors 100 and 200, and is thus accessible by the first and second processors 100 and 200. The internal register 80 may include a flip-flop, data latch or SRAM cell, for example. The internal register 80 may include a semaphore area 81, a first mailbox area 82 (e.g., mail box A to B), a second mailbox area 83 (e.g., mail box B to A), a check bit area 84, and reserve area 85. The areas 81-85 may be enabled in common by a specific row address, and accessed individually by an applied column address. For example, when row address 0x7FFFFFFFh~0x8FFFFFFFh, indicating a specific row area 121 of the shared memory area 11, is applied, a portion area 121 of the shared memory area 11 is disabled and the internal register 80 is enabled.

As would be appreciated by one of ordinary skill in the relevant art, a control authority for the shared memory area 11 is written in the semaphore area 81. Also, a message, e.g., authority request, transmission data and command, etc., given to a counterpart processor is written in the first and second mailbox areas 52 and 53, according to a predetermined transmission direction.

In FIG. 9, the control unit 30 controls a path to operationally connect the shared memory area 11 to one of the first and second processors 100 and 200. A signal line R1, connected between the first port 60 and the control unit 30, transfers a first external signal applied through bus B1 from the first processor 100. A signal line R2, connected between the second port 61 and the control unit 30, transfers a second external signal applied through bus B2 from the second processor 200. The first and second external signals may include a row address strobe signal RASB, write enable signal WEB and bank selection address BA, e.g., separately applied through the first and second ports 60 and 61. Signal lines C1 and C2, connected between the control unit 30 and each multiplexer 40, 41, operationally connect the shared memory area 11 to the first or second port 60, 61, e.g., based on corresponding transfer path decision signals MA, MB.

Figure 10:
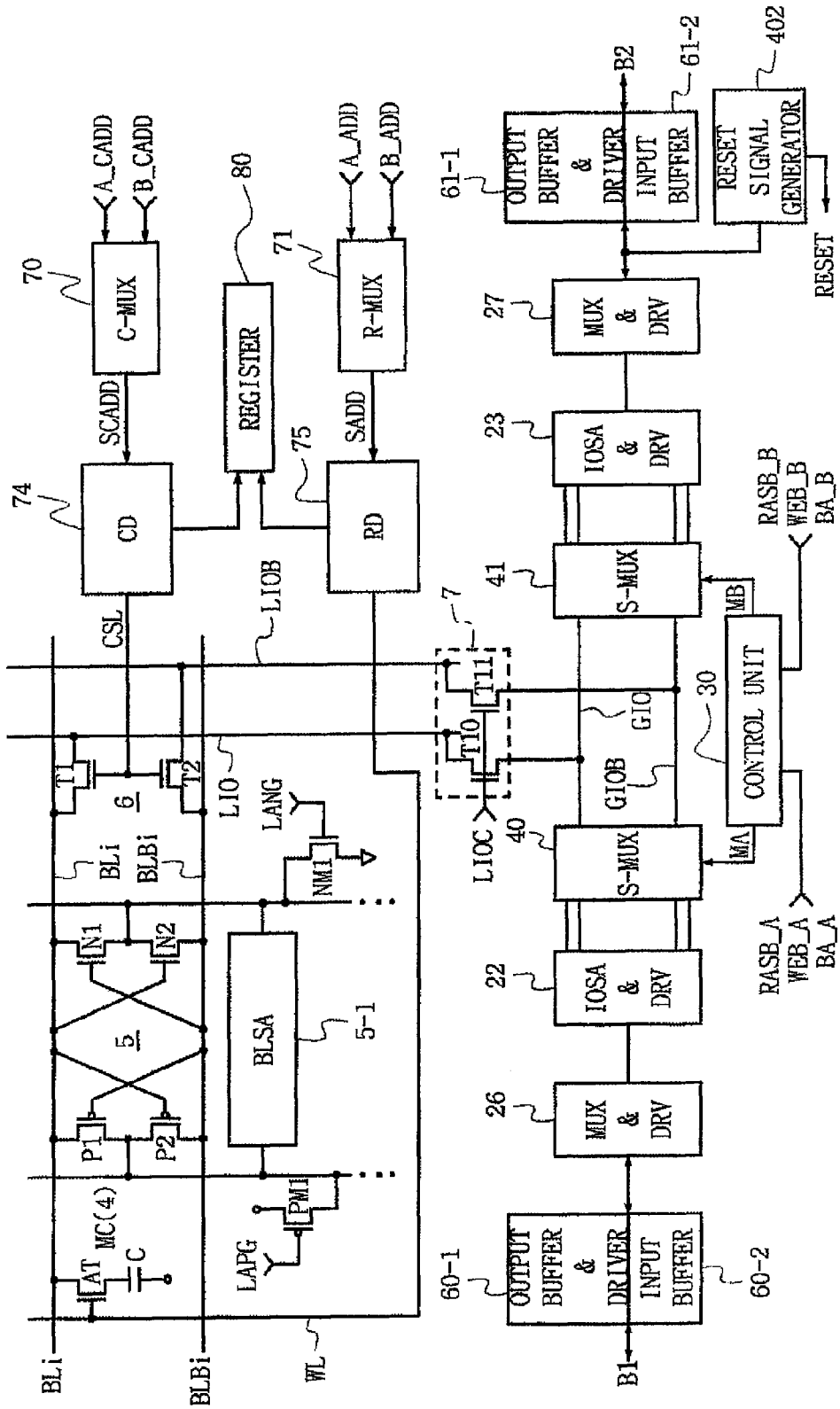
FIG. 10 is a block diagram of a multipath access related circuit for a shared memory area, referred to in FIG. 9, according to an exemplary embodiment of the invention.

FIG. 10 is a block diagram of a multipath access related circuit for a shared memory area, referred to in FIG. 9, according to an exemplary embodiment. Referring to FIG. 10, second multiplexers 40 and 41 are arranged symmetrically on the shared memory area 11, and input/output sense amplifiers and drivers 22 and 23 are arranged symmetrically to each other. In the shared memory area 11, a DRAM cell 4, including an access transistor AT and a storage capacitor C, forms one memory unit. The DRAM cells 4 are coupled to intersections of multiple word lines and multiple bit lines, forming a matrix type bank array.

A word line WL shown in FIG. 10 is between a gate of access transistor AT of the depicted DRAM cell 4 and a row decoder 75. The row decoder 75 applies a row decoding signal to the word line and the register 80 in response to a selected row address SADD of a row address multiplexer 71. A bit line BLi constituting a bit line pair is coupled to a drain of the access transistor AT and a column selection transistor T1. A complementary bit line BLBi is coupled to a column selection transistor T2. PMOS transistors P1 and P2 and NMOS transistors N1 and N2 coupled to the bit line pair BLi, BLBi constitute a bit line sense amplifier. Sense amplifier driving transistors PM1 and NM1 respectively receive drive signals LAPG and LANG to drive the bit line sense amplifier. A column selection gate 6, which includes the column selection transistors T1 and T2, is connected to a column selection line CSL transferring a column decoding signal of column decoder 74. The column decoder 74 applies a column decoding signal to the column selection line CSL and the register 80 in response to a selection column address SCADD of a column address multiplexer 70.

In FIG. 10, a local input/output line pair LIO, LIOB is connected to a first multiplexer (F-MUX) 7, which includes transistors T10 and T11. When the transistors T10 and T11 are turned on by a local input/output line control signal LIOC, the local input/output line pair LIO, LIOB is connected to a global input/output line pair GIO, GIOB. Then, in a data read operating mode, data appearing on the local input/output line pair LIO, LIOB is transferred to the global input/output line pair GIO, GIOB. In contrast, in a data write operating mode, write data applied to the global input/output line pair GIO, GIOB is transferred to the local input/output line pair LIO, LIOB. The local input/output line control signal LIOC may be generated in response to a decoding signal output from the row decoder 75.

When path decision signal MA output from the control unit 30 has an active state, read data transferred to the global input/output line pair GIO, GIOB is transferred to the input/output sense amplifier and driver 22 through the second multiplexer 40. The input/output sense amplifier and driver 22 amplifies data having a weakened level due to the data path transfer. Read data output from the input/output sense amplifier and driver 22 is transferred to the first port 60 through the multiplexer and driver 26. Meanwhile, the path decision signal MB is in an inactive state, thus the second multiplexer 41 is disabled, preventing access to the shared memory area 11 by the second processor 200. However, the second processor 200 may still access the dedicated memory areas 12 and 13 through the second port 61.

When the path decision signal MA output from the control unit 30 is in the active state, write data applied through the first port 60 is transferred to the global input/output line pair GIO, GIOB, sequentially passing through the multiplexer and driver 26, the input/output sense amplifier and driver 22 and the second multiplexer 40. When the first multiplexer 7 is activated, the write data is transferred to the local input/output line pair LIO, LIOB and then is stored in a selected memory cell 4.

An output buffer and driver 60-1 and input buffer 60-2, shown in FIG. 10, may correspond to or be included in the first port 60 of FIG. 9.

The shared memory area 11 includes two input/output sense amplifiers and drivers 22 and 23. Also, the second multiplexers 40 and 41 have mutually complementary operations, thus preventing multiple processors from simultaneously accessing data of the shared memory area 11.

The first and second processors 100 and 200 commonly use circuit devices and lines that are adapted between global input/output line pair GIO, GIOB and memory cell 4 in an access operation, and separately use input/output related circuit devices and lines between respective ports and the second multiplexer 40, 41. More particularly, the global input/output line pair GIO, GIOB of the shared memory area 11, the local input/output line pair LIO, LIOB operationally connected to the global input/output line pair, the bit line pair BL, BLB operationally connected to the local input/output line pair through column selection signal CSL, the bit line sense amplifier 5 installed on the bit line pair BL, BLB to sense and amplify data of bit line, and the memory cell(s) 4 in which access transistor AT is connected to the bit line BL, are shared by the first and second processors 100 and 200 through the first and second ports 60 and 61, respectively.

As described above, in the semiconductor memory device 410 of FIG. 2, having detailed exemplary configurations shown in FIGS. 9 and 10, an interface function between processors 100 and 200 can be attained. The processors 100 and 200 perform data communication through the commonly accessible shared memory area 11 using internal register 80 functioning as an interface. A precharge skip problem may also be solved in an access authority transfer.

In addition, in the various embodiments, the reset signal generator 402, e.g., shown in FIGS. 9 and 10, generates a reset enable signal and a reset disable signal, depending upon processors or by itself. Reset pin P11 shown in FIG. 2 can be assigned using a ball and pad adapted in reserve in a DRAM chip, for example.

Figure 11:
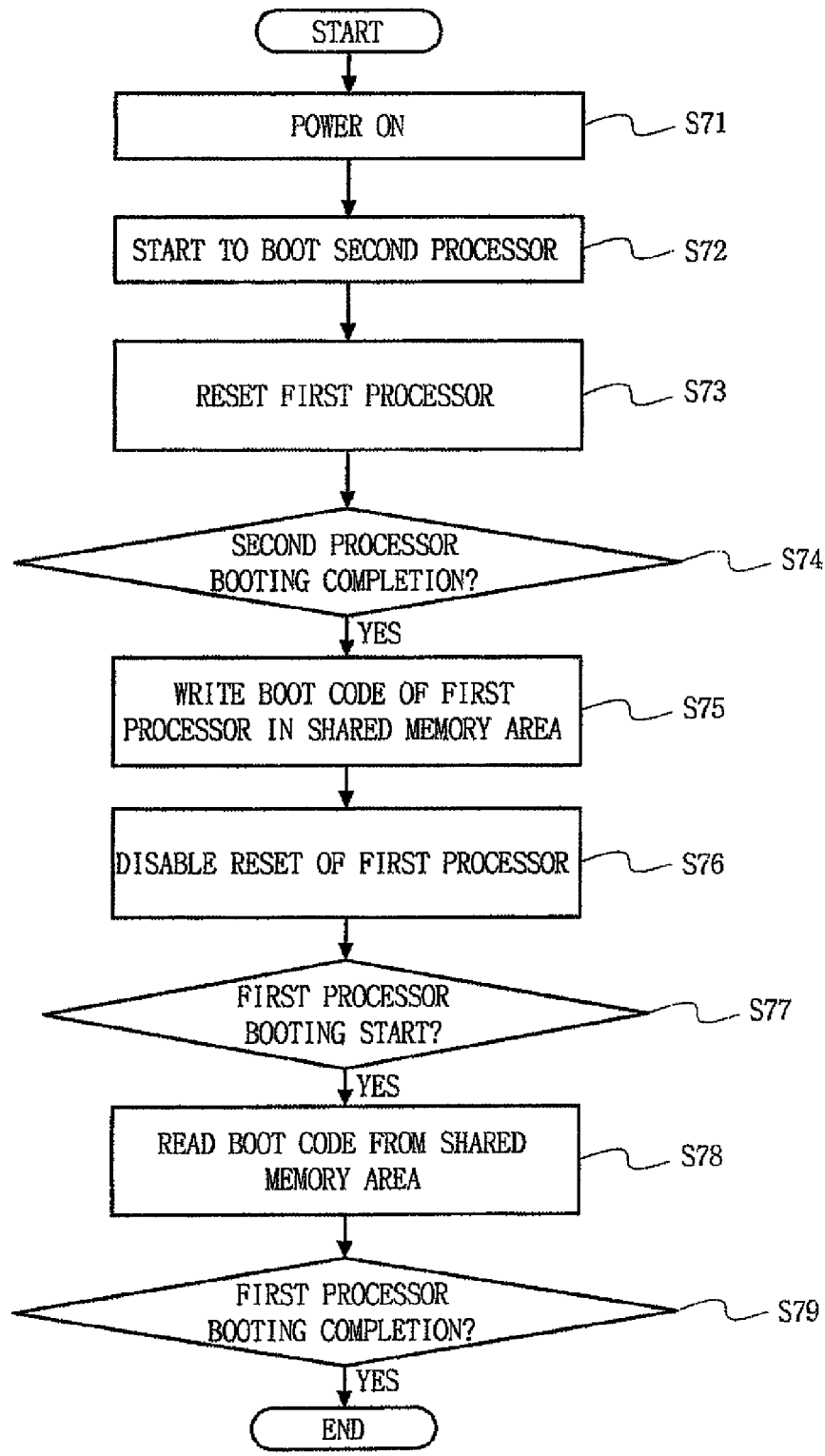
FIG. 11 is a flowchart of a reset control of processor, according to an exemplary embodiment of the invention.

By way of additional description, FIG. 11 illustrates a flowchart for reset control of a processor, according to an exemplary embodiment of the invention.

FIG. 11 provides a sequence of steps from step S71, performing power-on, to step S79, checking whether the first (slave) processor 100 has completed booting. For purposes of explanation, it is assumed that the multipath accessible semiconductor memory device 410 is a OneDRAM™, adapted to include reset pin P11 shown in FIG. 2. When power-on starts at step S71, the second (master) processor 200 begins to boot at step S72. At this time, a reset enable signal is applied to the first processor 100 through the reset pin P11 at step S73, so that the first processor 100 is not booted. The first processor 100, upon receiving the reset enable signal, enters a reset mode and is prevented from performing a booting operation over time.

At step S74, it is determined whether a booting operation of the second processor 200 is completed. When the booting operation is completed, the second processor 200 reads a boot code of the first processor stored in a flash memory, and writes it to a shared memory area of the semiconductor memory device 410 at step S75. The second processor 200 performs a setting for a value indicating a release of the reset enable in an EMRS register of the semiconductor memory device 410, or the reset signal generator 402 generates a reset disable signal, in response to which the reset of the first processor 100 is released at step S76. Then, booting of the first processor 100 begins, the start of which is determined at step S77. During the booting operation, the first processor 100 reads its own boot code from the shared memory area of the semiconductor memory device 410 at step S78. Completion of the booting operation of the first processor 100 is checked at step S79.

Although described with reference to two processors, it is understood that the various embodiments of the multiprocessor system may be applied to any number of processors. Also, it is understood that each processor of the multiprocessor system may be a microprocessor, CPU, digital signal processor, micro controller, reduced command set computer, complex command set computer, or the like.

However, it should be further understood that the scope of the invention is not limited to the number of processors in the system or to any particular combination of processors. For example, of the four exemplary memory areas, one may be designated a shared memory area and remaining three may be designated dedicated memory areas, as described above. Alternatively, all four memory areas may be designated shared memory areas.

In addition, when three or more processors are incorporated into the system, three or more ports may be adapted in the semiconductor memory device 410, and one of three or more processors may access a predetermined shared memory at a specific time. Furthermore, although OneDRAM™ is described above as an example, embodiments of the invention may be applied to static random access memories, nonvolatile memories, etc.

As described above, according to embodiments of the invention, a "boot time-over" state of a slave processor is prevented, thereby avoiding a halt of the slave processor operation. Additionally, a reset signal line between processors may be eliminated and a reset of the slave processor may be efficiently and rapidly controlled through a multipath accessible semiconductor memory device.

It will be apparent to those skilled in the art that modifications and variations can be made without deviating from the spirit or scope of the invention. Thus, it is intended that embodiments of the present invention cover such modifications and variations. For example, detailed configurations of the reset signal generator or memory bank, or a circuit configuration and access method, may be varied and changed diversely.

In the drawings and specification, there have been disclosed exemplary embodiments of the invention and, although specific terms are employed, they are used in a generic and descriptive sense and not for purposes of limitation. While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A semiconductor memory device for use in a multiprocessor system, the device comprising:
a shared memory area accessible by a plurality of processors of the multiprocessor system through different ports, the shared memory area being assigned to a portion of a memory cell array; and
a reset signal generator configured to provide a reset enable signal to a processor, predetermined as a slave processor among the plurality of processors, for a predetermined time after an initial booting of the multiprocessor system, and to provide a reset disable signal to the slave processor after the predetermined time lapses,
wherein the reset signal generator comprises:
a mode register set circuit configured to output a register setting signal in response to an external signal;
a latch configured to latch the register setting signal applied through an input node;
a switching transistor configured to discharge the input node in response to a power-up reset related signal; and
a driver configured to drive an output signal of the latch and to output the output signal as one of the reset enable signal or the reset disable signal.

2. The device of claim 1, wherein the reset enable signal is generated in the semiconductor memory device, and the reset disable signal is generated in the semiconductor memory device under control of a processor, predetermined as a master processor among the plurality processors.

3. The device of claim 2, wherein the semiconductor memory device comprises a DRAM type memory used in common by the plurality of processors, and the multiprocessor system includes a nonvolatile semiconductor memory device for storing a boot code.

4. The device of claim 3, wherein the reset signal generator comprises an externally controllable mode register set circuit.

5. The device of claim 3, wherein the reset signal generator comprises an externally controllable extended mode register set circuit.

6. The device of claim 1, wherein the reset enable signal and the reset disable signal are generated in the semiconductor memory device.

7. The device of claim 1, further comprising:
an internal register accessible in response to an address of the shared memory area to provide an interface function among the plurality of processors, the internal register being located outside the memory cell array.

8. The device of claim 7, wherein the memory cell array further comprises dedicated memory areas, each dedicated memory area being accessible by one processor of the plurality of processors.

9. A semiconductor memory device for use in a multiprocessor system, the device comprising:
a shared memory area accessible by a plurality of processors of the multiprocessor system through different ports, the shared memory area being assigned to a portion of a memory cell array; and
a reset signal generator configured to provide a reset enable signal to a processor, predetermined as a slave processor among the plurality of processors, for a predetermined time after an initial booting of the multiprocessor system, and to provide a reset disable signal to the slave processor after the predetermined time lapses,
wherein the reset enable signal and the reset disable signal are generated in the semiconductor memory device,
wherein the reset signal generator comprises:
a power voltage sensing unit configured to sense a source voltage in the initial booting of the multiprocessor system, and to output a power-up reset related signal;
an address signal level sensing unit configured to sense a level of an address signal output through an address buffer, and to output an operation state signal;
a gating unit configured to gate the power-up reset related signal and the operation state signal, and to output a gating output signal; and
a signal output unit configured to drive the gating output signal of the gating unit, to delay the power-up reset related signal and to drive the delayed power-up reset related signal in order to internally generate one of the reset enable signal or the reset disable signal.

10. A multiprocessor system comprising:
at least two processors, each processor being configured to perform a predetermined task, at least one of the processors being predetermined to be a slave processor;
a nonvolatile semiconductor memory connected to one of the processors, the nonvolatile semiconductor memory storing boot codes corresponding to the processors; and
a semiconductor memory device comprising a shared memory area, assigned to a portion of a memory cell array, and a reset signal generator, the shared memory area providing a data interface operation between the processors and being accessible in common by the processors through different ports, and the reset signal generator providing a reset enable signal to the slave processor for a predetermined time after an initial booting of the system and providing a reset disable signal to the slave processor after the predetermined time lapses,
wherein the reset signal generator comprises:
a mode register set circuit for outputting a register setting signal in response to an external signal;
a latch for latching the register setting signal applied through an input node;
a switching transistor for discharging the input node in response to a power-up reset related signal; and
a driver for driving an output signal of the latch and outputting the output signal as the reset enable signal or reset disable signal.

11. The system of claim 10, wherein the nonvolatile semiconductor memory device comprises a NAND flash memory.

12. The system of claim 10, wherein at least one of the processors is predetermined to be a master processor, and
wherein the reset enable signal is generated in the semiconductor memory device, and the reset disable signal is generated in the semiconductor memory device under control of the master processor.

13. The system of claim 10, wherein the reset signal generator comprises an externally controllable mode register set circuit or extended mode register set circuit.

14. The system of claim 10, wherein the reset enable signal and the reset disable signal are generated in the semiconductor memory device.

15. A multiprocessor system comprising:
at least two processors, each processor being configured to perform a predetermined task, at least one of the processors being predetermined to be a slave processor;
a nonvolatile semiconductor memory connected to one of the processors, the nonvolatile semiconductor memory storing boot codes corresponding to the processors; and a semiconductor memory device comprising a shared memory area, assigned to a portion of a memory cell array, and a reset signal generator, the shared memory area providing a data interface operation between the processors and being accessible in common by the processors through different ports, and the reset signal generator providing a reset enable signal to the slave processor for a predetermined time after an initial booting of the system and providing a reset disable signal to the slave processor after the predetermined time lapses, wherein the reset signal generator comprises:

a power voltage sensing unit for sensing a source voltage in the initial booting of the system, and outputting a power-up reset related signal;

an address signal level sensing unit for sensing a level of address signal output through an address buffer, and outputting an operation state signal;

a gating unit for gating the power-up reset related signal and the operation state signal, and outputting a gating output signal; and a signal output unit for driving the gating output signal of the gating unit, delaying and driving the power-up reset related signal, thereby generating the reset enable signal or reset disable signal without assistance from an external processor.

* * * * *